United States Patent
Kim et al.

(10) Patent No.: US 6,580,111 B2
(45) Date of Patent: Jun. 17, 2003

(54) METAL-INSULATOR-METAL CAPACITOR

(75) Inventors: Wan-don Kim, Suwon (KR); Jin-won Kim, Seoul (KR); Seok-jun Won, Seoul (KR); Cha-young Yoo, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/863,679

(22) Filed: May 23, 2001

(65) Prior Publication Data

US 2001/0054730 A1 Dec. 27, 2001

(30) Foreign Application Priority Data

Jun. 7, 2000 (KR) .......................... 2000-31031

(51) Int. Cl.⁷ ............................................ H01L 27/108
(52) U.S. Cl. ................... 257/301; 438/243; 438/386
(58) Field of Search ..................... 257/301; 438/243, 438/386

(56) References Cited

U.S. PATENT DOCUMENTS

| | | | | |
|---|---|---|---|---|
| 4,891,684 A | * | 1/1990 | Nishioka et al. | 257/310 |
| 5,070,384 A | * | 12/1991 | McCollum et al. | |
| 5,216,572 A | * | 6/1993 | Larson et al. | 361/313 |
| 5,668,040 A | * | 9/1997 | Byun | 438/396 |
| 5,712,813 A | * | 1/1998 | Zhang | 365/149 |
| 6,046,489 A | * | 4/2000 | Yamaguchi | 257/532 |
| 6,060,736 A | * | 5/2000 | Noshiro | 257/295 |
| 6,078,493 A | * | 6/2000 | Kang | 257/310 |
| 6,180,481 B1 | * | 1/2001 | Deboer et al. | 438/396 |
| 6,215,646 B1 | * | 4/2001 | Ochiai et al. | 257/301 |
| 6,222,219 B1 | * | 4/2001 | Gambino et al. | 257/306 |
| 6,287,910 B2 | | 9/2001 | Lee et al. | 438/240 |
| 6,303,958 B1 | * | 10/2001 | Kanaya et al. | 257/310 |
| 6,306,667 B1 | * | 10/2001 | Arita et al. | 438/3 |
| 6,407,419 B1 | * | 6/2002 | Okudaira | 257/295 |
| 6,437,391 B1 | * | 8/2002 | Oh | 257/306 |
| 2001/0014498 A1 | * | 8/2001 | Amico et al. | 438/243 |
| 2002/0000598 A1 | * | 1/2002 | Kang et al. | 257/301 |

FOREIGN PATENT DOCUMENTS

| | | | |
|---|---|---|---|
| JP | 6224070 | 8/1994 | ........... H01G/4/06 |
| KR | 97-038706 | 3/1999 | |
| KR | 10-1998-0024753 | 1/2000 | |
| KR | P2001-0057926 | 5/2001 | ....... H01L/21/8242 |

\* cited by examiner

*Primary Examiner*—David Nelms
*Assistant Examiner*—Andy Huynh
(74) *Attorney, Agent, or Firm*—Mills & Onello, LLP

(57) ABSTRACT

A metal-insulator-metal (MIM) capacitor of a semiconductor device, and a manufacturing method thereof, includes a lower electrode formed of a refractory metal or a conductive compound including the refractory metal, a dielectric film formed of a high dielectric material, and an upper electrode formed of a platinum-family metal or a platinum-family metal oxide. Accordingly, the MIM capacitor satisfies the criteria of step coverage, electrical characteristics and manufacturing costs, as compared to a conventional MIM capacitor in which the upper and lower electrodes are formed of the same material such as a platinum-family metal, a refractory metal or a conductive compound including the refractory metal. The capacitor is especially suitable for mass production in semiconductor fabrication processes.

3 Claims, 6 Drawing Sheets

FIG. 1

| Ru, Pt, RuO$_2$, PtO$_2$ OR IrO$_2$ | — 14 |
|---|---|
| Ta$_2$O$_5$, Al$_2$O$_3$ OR TaON | — 12 |
| Ti, TiN, TiSiN, TiAlN, Ta, TaN, TaSiN, TaAlN, W OR WN | — 10 |

FIG. 2

| Ru, Pt, RuO$_2$, PtO$_2$ OR IrO$_2$ | — 14 |
|---|---|
| Ta$_2$O$_5$, Al$_2$O$_3$ OR TaON | — 12 |
| Si$_3$N$_4$, Al$_2$O$_3$, TaON, HfO$_2$ OR ZrO$_2$ | — 20 |
| Ti, TiN, TiSiN, TiAlN, Ta, TaN, TaSiN, TaAlN, W OR WN | — 10 |

METAL-INSULATOR-METAL CAPACITOR

BACKGROUND OF THE INVENTION

1. Field of the Invention

The present invention relates to a capacitor for a semiconductor device and a manufacturing method thereof, and more particularly, to a capacitor having a metal-insulator-metal structure (hereinafter, referred to as a MIM capacitor) and a manufacturing method thereof.

2. Description of the Related Art

As semiconductor technology evolves, the area occupied by each device on a chip gradually decreases due to an increase in integration density. Such devices include capacitors, which for example are responsible for storing information on a dynamic random access memory (DRAM). Capacitors are required to maintain large capacitance values, even though integration requires there area to continue to decrease.

A number of methods have been proposed for achieving integration of capacitors These include: broadening the surface area of an electrode by forming a capacitor electrode in a three-dimensional shape such as a cylindrical shape, a fine shape, or the like; forming hemispherical grains (HSG) on the electrode surface; reducing the thickness of the dielectric film, and employing a high dielectric material having a high dielectric constant or a ferroelectric material as the dielectric film in the capacitor.

In the case where a material having a high dielectric constant, for example, $Ta_2O_5$ or $BST((Ba,Sr))TiO_3)$, is used as the dielectric film, it is difficult to use polycrystalline silicon, which is used as an electrode material in the prior art, to form an electrode, since a reduction in the thickness of a dielectric film causes tunneling, thereby increasing leakage current in the device. The leakage current can be mitigated/prevented by sandwiching a film having a low dielectric constant, such as, SiON, between a polycrystalline silicon electrode and a dielectric film. However, this method results in degradation in the total capacitance.

Hence, a capacitor, which uses a metal having a high work function, such as, TiN or a platinum-family metal such as Pt, instead of polycrystalline silicon, as an electrode material, has been proposed. Korean Patent Laid-Open Publication Gazette No. 2000-3511 discloses an MIM capacitor in which a $Ta_2O_5$ dielectric film is sandwiched between upper and lower electrodes made of TiN or Pt.

However, in a $TiN/Ta_2O_5/TiN$ capacitor, the material, TiN, of upper and lower electrodes reacts with the $Ta_2O_5$ layer of the dielectric film when they are deposited or when they undergo a subsequent thermal treatment, resulting in deterioration of capacitor characteristics. This reaction can be prevented by interposing a reaction-preventing film of a low dielectric material such as $Si_3N_4$ between the dielectric film and each of the upper and lower electrodes. However, this also leads to a degradation in the capacitance and results in a rather complicated manufacturing process.

In a $Pt/Ta_2O_5/Pt$ capacitor, there are no reactions between the dielectric film and upper and lower electrodes, but the use of a Pt-family metal is relatively expensive. In particular, deposition techniques providing a good step coverage necessary for forming an electrode in a three-dimensional shape, and simple etching techniques to achieve patterning at a low cost are not put into practical use, so that they are inadequate for mass production.

When a particular material is used as upper and lower electrodes and as a dielectric film of a capacitor, the increase in the leakage current and the degradation in the capacitance must be prevented, and also the stability, uniformity and long reliability necessary for mass production must be guaranteed. Furthermore, the economic efficiency must be satisfied. Therefore, despite recent improvements such as the adoption of various materials, as described above, the capacitor must be continuously improved in terms of practical utilization.

SUMMARY OF THE INVENTION

To address the above limitations, it is an object of the present invention to provide a capacitor which satisfies all of the aforementioned characteristics.

Another object of the present invention is to provide a method of manufacturing a capacitor which satisfies all of the aforementioned characteristics.

To achieve the first object, the present invention provides a capacitor in which a dielectric film is formed of a high dielectric material, a lower electrode is formed of a refractory metal such as Ti, Ta and W, or a conductive compound including the refractory metal, such as TiN, TiSiN, TiAlN, TaN, TaSiN, TaAlN and WN, and an upper electrode is formed of a platinum-family metal such as Ru, Pt or Ir, or a platinum-family metal oxide such as $RuO_2$, PtO or $IrO_2$.

Preferably, the high-dielectric material is $Ta_2O_5$, $Al_2O_3$ or TaON.

A reaction prevention film can be further included between the lower electrode and the dielectric film, to prevent the reaction between the material of the lower electrode and that of the dielectric film. The reaction prevention film is preferably formed of $Si_3N_4$, $Al_2O_3$, TaON, $HfO_2$ or $ZrO_2$.

To achieve the second object, the present invention provides a method of manufacturing a capacitor, including: forming a lower electrode of the above-described refractory metal or the above-described conductive compound including the refractory metal on a substrate; forming a dielectric film of the above-described high dielectric material on the lower electrode; and forming an upper electrode of a platinum-family metal or a platinum-family metal oxide on the dielectric film.

Here, it is preferable that the upper or upper electrode is formed by chemical vapor deposition (CVD) or atomic layer deposition (ALD). In particular, these deposition techniques are preferable to form a three-dimensional electrode such as a cylindrical electrode.

The dielectric film can have improved electrical characteristics by undergoing a thermal treatment or plasma process immediately after the dielectric film is formed or after an upper electrode is formed.

Also, the dielectric film can be formed in multiple steps by repeating deposition and thermal treatment or plasma processing for improving the electrical characteristics.

After the step of forming a lower electrode, a reaction prevention film can be formed to prevent the reaction between the material of the lower electrode and that of the dielectric film. Preferably, the reaction prevention film is formed by depositing one among the above-mentioned materials to be in an amorphous state. It is also preferable that, when a reaction prevention film is formed, thermal treatment for crystallizing the dielectric film is further performed after an upper electrode is formed.

According to the present invention, as described above, a refractory metal, which is relatively easy to deposit and pattern, or a conductive compound including a refractory metal, is used to form a lower electrode, and a platinum-family metal or a platinum-family metal oxide, the electrical properties of which is suited for a high dielectric material, is used to form an upper electrode. Thus, a capacitor, which satisfies many characteristics such as a negligible leakage current, high capacitance and the suitability for mass production, can be obtained.

BRIEF DESCRIPTION OF THE DRAWINGS

The above objects and advantages of the present invention will become more apparent by describing in detail preferred embodiments thereof with reference to the attached drawings in which:

FIG. 1 is a cross-sectional view of the structure of electrodes and a dielectric film of a capacitor according to an embodiment of the present invention;

FIG. 2 is a cross-sectional view of the structure of electrodes and a dielectric film of a capacitor according to a modified embodiment of the present invention;

DETAILED DESCRIPTION OF PREFERRED EMBODIMENTS

Figure 3:
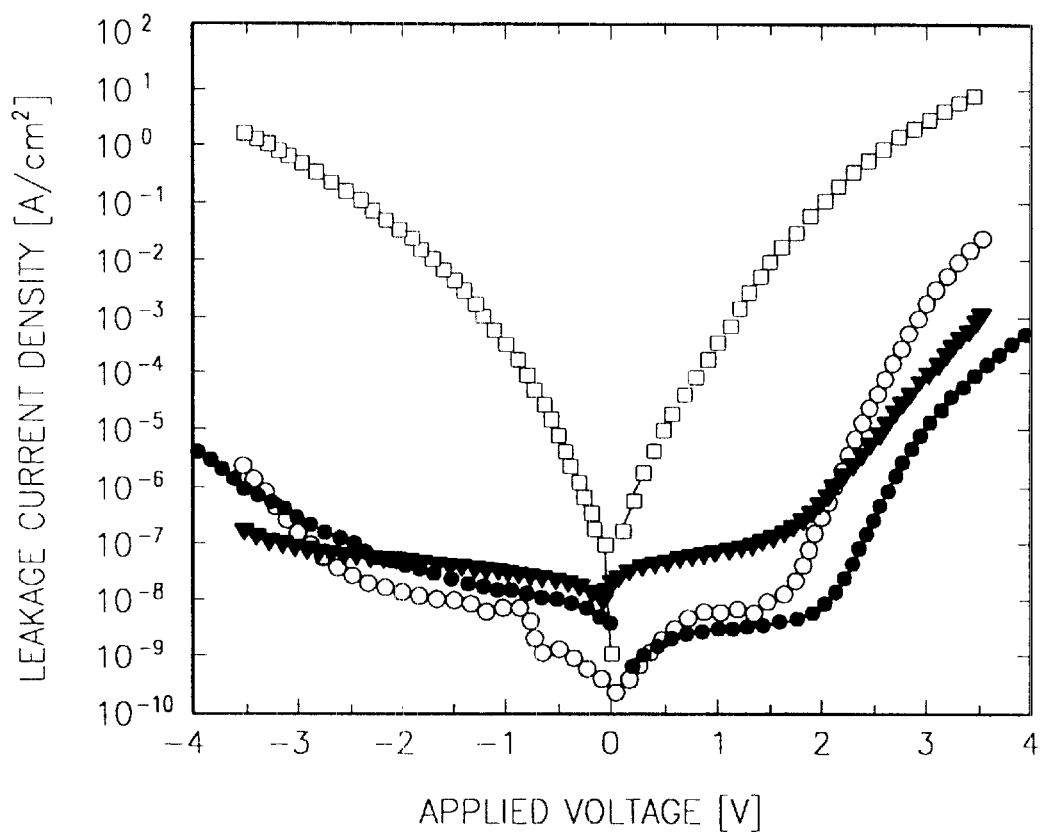
FIG. 3 is a graph comparing the leakage current densities of a conventional capacitor and a capacitor according to the present invention.

Hereinafter, embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art. In the drawings, the thicknesses of layers or regions are exaggerated for clarity. Like reference numerals in the drawings denote the same members. Also, when it is written that a layer (film) is formed "on" another layer (film) or a substrate, the layer (film) can be formed directly on the other layer (film) or the substrate, or other layers (films) can intervene therebetween.

FIG. 1 conceptually shows the structure of electrodes and a dielectric film according to an embodiment of the present invention. A capacitor according to the present invention shown in FIG. 1 is a planar type capacitor. However, the capacitor according to the present invention can have a variety of shapes such as a cylindrical shape, a fin shape or a shape in which the longitudinal cross-section of the capacitor is a trapezoid or an inverted-trapezoid.

Referring to FIG. 1, a lower electrode 10 in a capacitor according to the embodiment of the present invention is formed of a refractory metal such as Ti, Ta and W or a refractory metal compound such as TiN, TiSiN, TiAlN, TaN, TaSiN, TaAlN and WN. In particular, when the lower electrode 10 has a three-dimensional structure such as a cylindrical shape, a refractory metal or refractory metal compound deposited by CVD or ALD providing good step coverage is preferable. The CVD or ALD method for the refractory metal or its compound has already been developed, so it can be readily employed. The formation of the lower electrode 10 by CVD or ALD will be described in detail below.

A dielectric film 12 of a capacitor according to this embodiment is formed of a high dielectric material having a significantly-higher dielectric constant than a silicon oxide film or a nitride film used in the prior art. Examples include $Ta_2O_5$, $Al_2O_3$ and TaON. It is preferable that the dielectric film 12 is also deposited by CVD or ALD, which may have been utilized likewise for the lower electrode 10, since the CVD or ALD provides suitable step coverage. The formation of the dielectric film 12 by CVD or ALD will also be described in detail below.

An upper electrode 14 of the capacitor is formed of a platinum-family metal such as Ru, Pt or Ir or a platinum-family metal oxide such as $RuO_2$, PtO or $IrO_2$. Such materials provide good electrical characteristics such as the leakage current characteristics, in capacitors that employ a high dielectric material as a dielectric film. It is preferable that the dielectric film 14 is also deposited by CVD or ALD likewise for the dielectric film 12 and the lower electrode 10 to obtain good step coverage. The formation of the upper electrode 14 by CVD or ALD will also be described in detail below.

As shown in FIG. 2, in a capacitor according to a modified embodiment of the present invention, a reaction preventing film 20 can be further provided between the lower electrode 10 formed of a refractory metal or its compound and the dielectric film 12 formed of a high dielectric material, in order to prevent a reaction between the material of the lower electrode 10 and the material of the dielectric film 12. Preferably, the reaction preventing film 20 is formed of $Si_3N_4$, $Al_2O_3$, TaON, $HfO_2$ or $ZrO_2$. As will be described below, preferably, the reaction preventing film 20 is deposited in an amorphous state, and then crystalized while thermally treating the dielectric film 12 after the upper electrode 14 is deposited.

FIG. 3 is a graph showing the leakage current densities of planar capacitors shown in FIGS. 1 and 2. In the measurements shown in FIG. 3, the lower electrode of the capacitor is CVD-TiN, and the dielectric film is a $Ta_2O_5$. The $Ta_2O_5$ dielectric film is formed in two steps by primarily depositing 90 Å of $Ta_2O_5$ and annealing the $Ta_2O_5$ using $UV-O_3$, and secondly depositing 60 Å of $Ta_2O_5$ and annealing the $Ta_2O_5$ using $UV-O_3$. In FIG. 3, ▼ and ● indicate capacitors according to the present invention in which an upper electrode is made of CVD-Ru. In particular, in the capacitor designated by ●, an $Si_3N_4$ reaction preventing film is interposed between a CVD-TiN lower electrode and a $Ta_2O_5$ dielectric film. □ designates a conventional capacitor in which the upper electrode is made of CVD-TiN, and ○ designates a conventional capacitor in which the upper electrode is made of physical vapor deposition (PVD)-TiN.

As can be seen from FIG. 3, the resulting leakage current densities of the capacitors (▼ and ●) according to the present invention using a CVD-Ru upper electrode are better than or equal to those of the conventional capacitors (□ and ○) using a TiN upper electrode. In particular, considering that the operating voltage of a capacitor is generally on the order of ±1 V, it becomes evident that the capacitors according to the present invention guarantee appropriate leakage current densities.

As for the conventional capacitors using a TiN upper electrode, the leakage current density of the CVD-TiN/

Ta$_2$O$_5$/CVD-TiN capacitor (□) is inferior to that of the PVD-TiN/Ta$_2$O$_5$/CVD-TiN capacitor (○). This is because CVD-TiN is deposited at a high temperature (about 500° C. or more) under a reducing atmosphere where oxygen within a Ta$_2$O$_5$ dielectric film is affected, such as, TiCl$_4$ or NH$_3$ atmosphere, whereas PVD-TiN is deposited at a low temperature (about 400° C. or less) under non-reducing atmosphere. Though described later, likewise, the CVD-Ru upper electrode in each of the capacitors (▼ and ●) is deposited using an O$_2$ gas which provides a non-reducing atmosphere and can cure the oxygen vacancy of a Ta$_2$O$_5$ dielectric film at a relatively low temperature, thus providing excellent leakage current characteristics. However, the PVD-TiN upper electrode is inadequate for cylindrical capacitors having a three-dimensional-shaped dielectric film having a large step difference.

As described above, the present invention provides an MIM capacitor using a dielectric film made of a high dielectric material, which provides an excellent step coverage and an excellent leakage current characteristic and also satisfies the economic efficiency and the suitability for mass production by forming the lower electrode 10 of a refractory metal or a conductive compound containing the refractory metal, and forming the upper electrode 14 of a platinum-family metal or a platinum-family metal oxide, as compared to conventional capacitors in which the upper and lower electrodes are formed of the same material.

Methods of manufacturing capacitors according to embodiments of the present invention will now be described with reference to FIGS. 4 through 9. Hereinafter, methods of manufacturing a capacitor according to the embodiment of the present invention will be described using a capacitor having a cylindrical electrode structure in which a CVD-Ru upper electrode is formed on a Ta$_2$O$_5$ dielectric film which is formed on a CVD-TiN lower electrode. However, the present invention is not limited to this embodiment, and it is apparent that the present invention can be embodied in various forms by using the above-described various materials.

Figure 4:
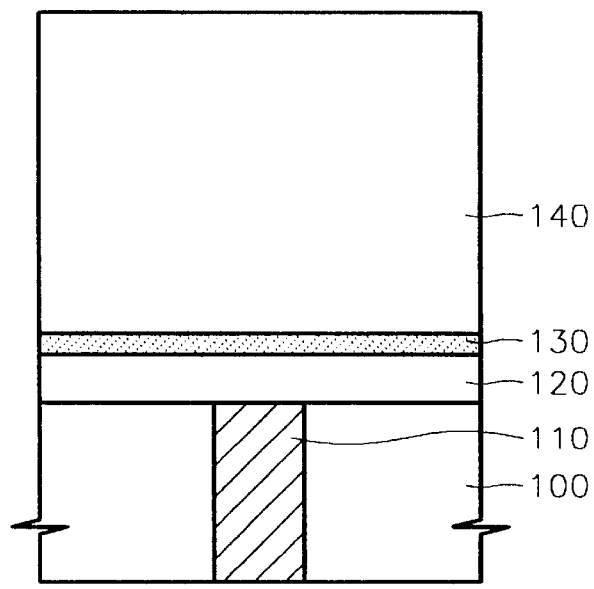
FIGS. 4 through 8 are cross-sectional views sequentially illustrating the procedures for manufacturing a capacitor according to an embodiment of the present invention.

Referring to FIG. 4, a lower electrode contact plug 110 is formed in an interlayer dielectric film 100 below which a device (not shown) such as a transistor is formed, and insulating films 120 and 140 as mold layers for forming a cylindrical lower electrode are provided on the resultant structure. For example, the insulating films 120 and 140 may comprise silicon oxide. In FIG. 4, reference numeral 130, which acts as an etch stop layer while the insulating film 140 is being etched, can be formed of a material having an etch selectivity with respect to the insulating film 140, for example, silicon nitride. The total thickness of the insulating films 120, 130 and 140 corresponds to the height of a lower electrode. In FIG. 4, the etch stop layer 130 is sandwiched between the insulating films 120 and 140. However, the location of the etch stop layer 130 is not limited to this embodiment. For example, the etch stop layer 130 can be formed on the interlayer dielectric film 100, exposing the lower electrode contact plug 110.

Figure 5:
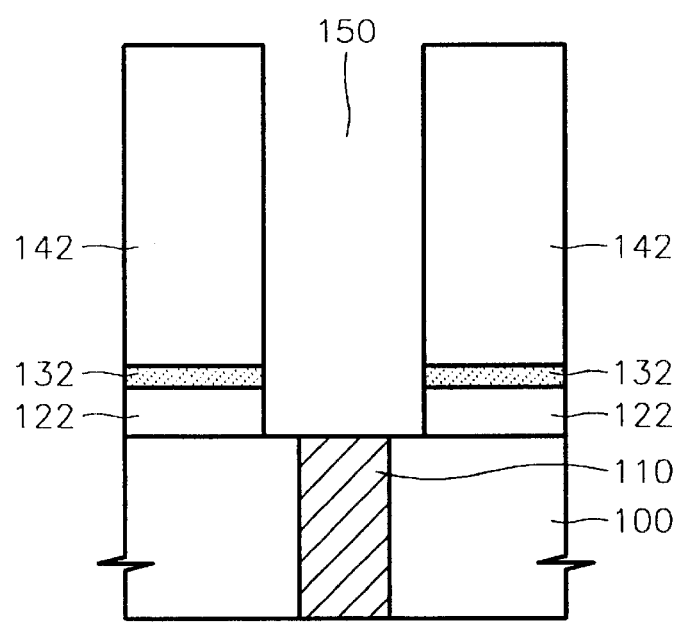

Next, as shown in FIG. 5, a trench 150, exposing the lower electrode contact plug 110, is formed by etching the insulating films 140 and 120 and the etch stop layer 130. A lower electrode will be formed on the side walls and bottom surface of the trench 150.

Figure 6:
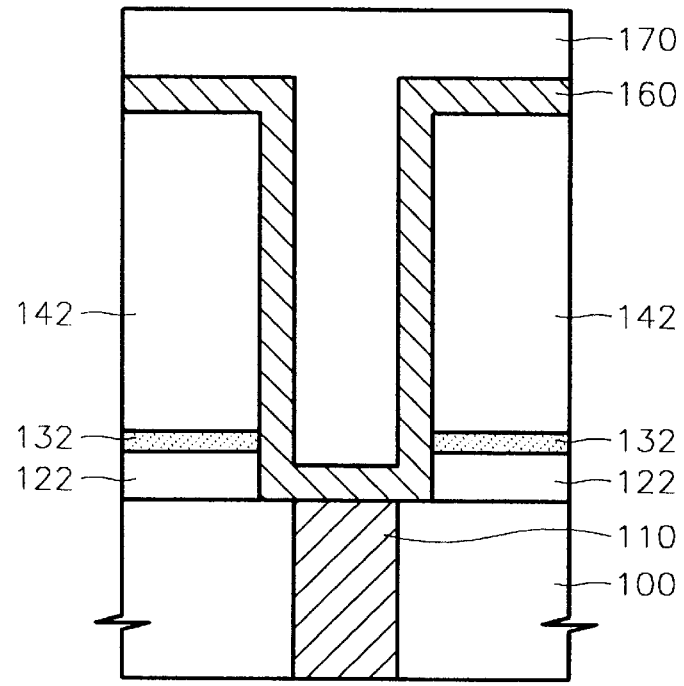
Figure 7:
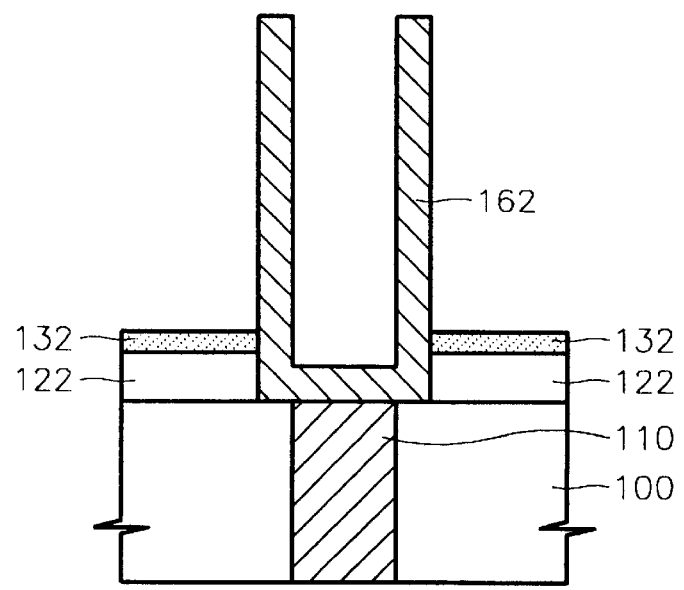

Then, as shown in FIG. 6, a TiN layer 160 for a lower electrode is conformally deposited on the entire surface of the trench 150 by CVD or ALD, and a material having excellent fluidity, for example, silicon oxide, is deposited on the TiN layer 160.

The TiN layer 160 is formed by CVD at a pressure of 0.1 to 10 Torr and at 600 to 700° C. using TiCl$_4$ and NH$_3$ as a source gas. When the TiN layer 160 is deposited by ALD, the same source gases are used, but only one source gas (for example, TiCl$_4$) at one time is supplied and chemically adsorbed on a substrate. Then, non-adsorbed source gas within a reaction chamber is purged, and the other source gas (for example, NH$_3$) is supplied. In this way, the formation of the TiN layer 160 on the substrate is repeated. When the TiN layer 160 is formed by ALD, the deposition is performed at a temperature of 450 to 550° C.

Thereafter, the structure of FIG. 6 is etched by chemical mechanical polishing or etch-back to expose the insulating film 142, thereby isolating adjacent lower electrodes from each other. The exposed insulating film 142 and an insulating film 170, which fills the trench, are removed, resulting in a structure shown in FIG. 7. If the insulating films 142 and 170 are made of the same material, they can be removed together in a single wet-etching or dry-etching process.

Figure 8:
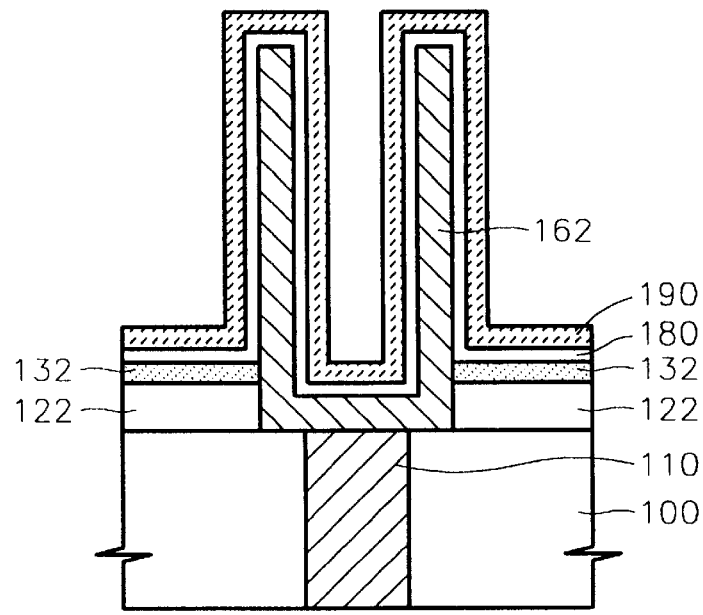

As shown in FIG. 8, a Ta$_2$O$_5$ dielectric film 180 and a Ru upper electrode 190 are formed on the cylindrical TiN lower electrode 162, thereby completing the formation of a capacitor.

To be more specific, the Ta$_2$O$_5$ dielectric film 180 is formed by CVD at 400 to 500° C. or by ALD at about 300° C. during supply of a Ta source gas obtained by vaporizing liquid Ta(OC$_2$H$_5$)$_5$ using a vaporizer, and an O$_2$ gas. As described above, the Ta$_2$O$_5$ dielectric film 180 is preferably deposited at a low temperature, thus providing excellent step coverage.

The electrical characteristics of the Ta$_2$O$_5$ dielectric film 180 can be improved by an ultraviolet thermal treatment or plasma process at an oxygen or nitrogen atmosphere containing O$_3$, after it is deposited. Also, the Ta$_2$O$_5$ dielectric film 180 can be deposited in multiple steps by repetitive deposition and UV-O$_3$ thermal treatment. Here, a dielectric film can be formed of a composite film by depositing and thermally treating different dielectric materials. Also, the dielectric constant of the Ta$_2$O$_5$ dielectric film 180 can be increased by thermal treatment for crystallization at or above about 700° C. Here, it is preferable that the thermal treatment for crystallization of the Ta$_2$O$_5$ dielectric film 180 is performed after the upper electrode is formed, as will be described later.

The Ru upper electrode 190 is formed by CVD or ALD at 250 to 450° C. while an Ru source gas obtained by vaporizing liquid Ru(C$_2$H$_5$C$_5$H$_4$)$_2$ and an O$_2$ reaction gas are being supplied. The surface morphology and electrical characteristics of the Ru film vary according to the conditions for deposition. As disclosed in Korean Patent Application No. 99-61337 filed on Dec. 23, 1999 by the present applicant and incorporated herein by reference, the Ru upper electrode 190 having a desired property can be obtained by varying the deposition conditions over the early and late stages of deposition. In this case, to be more specific, at the early stage of deposition, ruthenium deposited for a time period ranging from 5 seconds to 5 minutes in a state where the pressure within the reaction chamber is maintained at 10 to 50 Torr, more preferably, at 20 to 40 Torr, and the flow of an O$_2$ gas is maintained at 500 to 2000 sccm, more preferably, at 1000 to 1500 sccm. At the late stage of deposition, ruthenium is deposited until an Ru film having a desired thickness is formed, by maintaining the pressure within a reaction chamber at 0.05 to 10 Torr, more preferably, at 0.1 to 3 Torr, and maintaining the flow of an O$_2$ gas at 10 to 300 sccm, more preferably, at 50 to 150 sccm.

Figure 9:
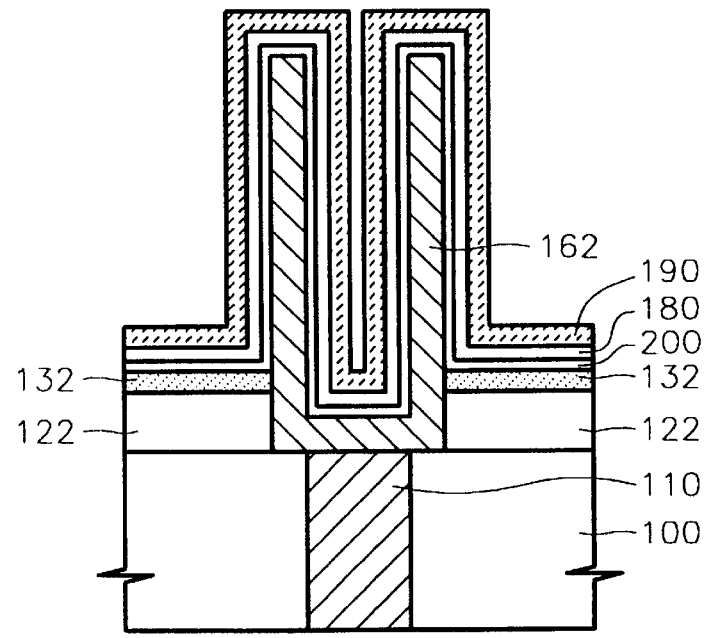
FIG. 9 is a cross-sectional view illustrating a process for manufacturing a capacitor according to a modified embodiment of the present invention.

In the modified embodiment of the present invention, as shown in FIG. 9, a $Si_3N_4$ reaction prevention film 200 can be sandwiched between the lower electrode 162 and the dielectric film 180. In this embodiment, the silicon nitride film 200 is formed on the entire surface of the substrate of FIG. 7 on which the cylindrical TiN lower electrode 162 is formed, by CVD using a Si source gas such as a silane-family gas and an N source gas such as $NH_3$. Next, the dielectric film 180 and the upper electrode 190 are formed on the resultant structure, thereby forming a capacitor according to this embodiment of the present invention. Here, preferably, the $Si_3N_4$ reaction prevention film 200 is deposited to be in an amorphous state at 600 to 700° C., and the dielectric film 180 is thermally treated and crystallized after the upper electrode 190 is formed. If the crystallization of the $Ta_2O_5$ dielectric film 180 is performed before the Ru upper electrode 190 is formed, the $Si_3N_4$ reaction prevention film 200 operates as a crystallization seed layer of the $Ta_2O_5$ dielectric film 180, so that the dielectric constant of the $Ta_2O_5$ dielectric film 180 slightly increases. In contrast, when the crystallization of the $Ta_2O_5$ dielectric film 180 is performed after the Ru upper electrode 190 is formed, the Ru upper electrode 190 operates as a crystallization seed layer of the $Ta_2O_5$ dielectric film 180, so that the dielectric constant of the $Ta_2O_5$ dielectric film 180 increases substantially.

Figure 10:
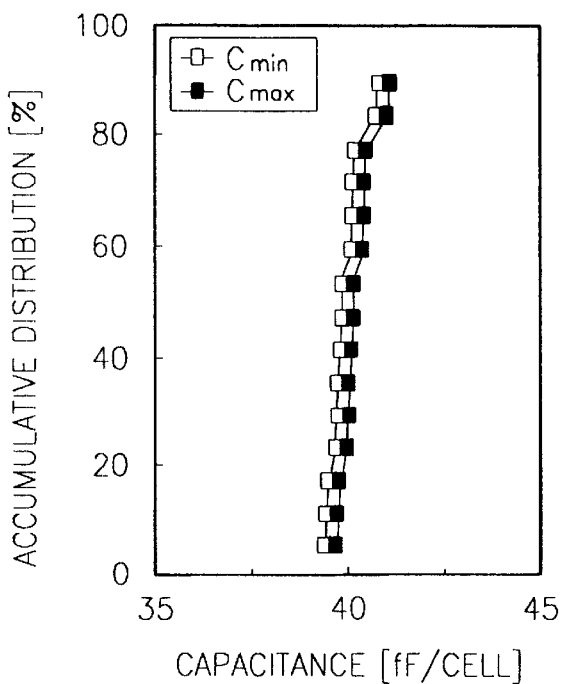
FIGS. 10 and 11 are graphs showing the accumulative distributions of the capacitance and leakage current density of a capacitor according to the present invention, respectively.
Figure 11:
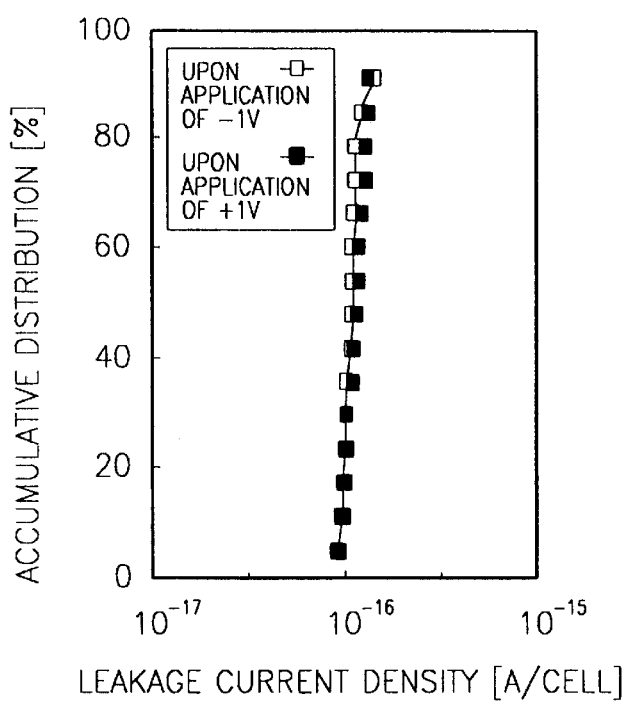

FIGS. 10 and 11 are graphs showing the accumulative distributions according to the electrical characteristics of a capacitor according to the embodiment of the present invention. In these experiments, a cylindrical capacitor having a CVD-Ru upper electrode/CVD-$Ta_2O_5$ dielectric film/CVD-TiN lower electrode structure is used, the height of the lower electrode is set to be about 1 $\mu$m, and the thickness of the dielectric film is set to be about 150 Å.

Referring to FIG. 10, the capacitance of a capacitor according to the embodiment of the present invention is about 40 fF per cell, and the ratio of $C_{min}/C_{max}$ is about 0.99. Referring to FIG. 11, when ±1 voltage was applied, a good leakage current density, about $10^{-16}$ A per cell, was measured.

In the above-described embodiments, upper and lower electrodes and a dielectric film are formed by depositing a particular material using a particular method. However, if a source gas is appropriately selected, other materials mentioned above can be used. In cases of capacitors not having a three-dimensional shape such as a cylindrical shape, it is apparent that the upper and lower electrodes and the dielectric film can be formed by other methods such as sputtering.

As described above, in capacitors using a high dielectric material to form a dielectric film, according to the present invention, a lower electrode is formed of a refractory metal or a conductive compound containing the refractory metal, the deposition and etching of which are put into practical use, so that a three-dimensional lower electrode can be formed with excellent step coverage. Also, an upper electrode is formed of a platinum-family metal or a platinum-family metal oxide, so that a capacitor having superior electrical characteristics can be obtained.

Also, an MIM capacitor according to the present invention satisfies the step coverage, the electrical characteristics and manufacturing costs, compared to a conventional MIM capacitor in which the upper and lower electrodes are formed of the same material such as a platinum-family metal, a refractory metal or a conductive compound including the refractory metal. In particular, by developing and applying a new CVD method to deposit a platinum-family metal such as Ru, which heretofore has had no practical deposition methods, the electrical characteristics of a capacitor can be guaranteed. Accordingly, the capacitors according to the present invention can be mass-produced.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A capacitor comprising:
   a cylindrical TiN lower electrode;
   a reaction prevention film formed on the TiN lower electrode;
   a $Ta_2O_5$ dielectric film formed on the reaction prevention film; and
   a CVD-Ru upper electrode formed on the $Ta_2O_5$ dielectric film;
   wherein said reaction prevention film prevents reaction between the TiN lower electrode material and the $Ta_2O_5$ dielectric film material during the formation of the $Ta_2O_5$ dielectric film and during a heat treatment conducted after formation of the CVD-Ru upper electrode; and
   wherein the CVD-Ru upper electrode operates as a crystallization seed layer of the $Ta_2O_5$ dielectric film during the heat treatment conducted after formation of the CVD-Ru upper electrode.

2. The capacitor of claim 1 wherein the reaction prevention film is formed of a $Si_3N_4$ material.

3. The capacitor of claim 1 wherein the reaction prevention film is formed of a material selected from the group consisting of $Al_2O_3$, TaON, $HfO_2$, and $ZrO_2$.

* * * * *